(12) United States Patent
Rücker et al.

(10) Patent No.: US 7,777,255 B2
(45) Date of Patent: Aug. 17, 2010

(54) BIPOLAR TRANSISTOR WITH RAISED BASE CONNECTION REGION AND PROCESS FOR THE PRODUCTION THEREOF

(75) Inventors: Holger Rücker, Bad Saarow (DE); Bernd Heinemann, Frankfurt (DE)

(73) Assignee: IHP GmbH—Innovations for High Performance Microelectronics / Leibniz-Instut für innovative Mikroelektronik, Frankfurt (DE)

(*) Notice: Subject to any disclaimer, the term of this patent is extended or adjusted under 35 U.S.C. 154(b) by 755 days.

(21) Appl. No.: 10/580,669

(22) PCT Filed: Dec. 3, 2004

(86) PCT No.: PCT/EP2004/013954

§ 371 (c)(1),
(2), (4) Date: Mar. 19, 2007

(87) PCT Pub. No.: WO2005/055324

PCT Pub. Date: Jun. 16, 2005

(65) Prior Publication Data

US 2007/0278621 A1    Dec. 6, 2007

(30) Foreign Application Priority Data

Dec. 5, 2003    (DE) ............................. 103 58 046

(51) Int. Cl.
*H01L 31/072* (2006.01)
(52) U.S. Cl. .................. 257/197; 257/565; 257/571; 257/E21.608; 257/E21.696; 257/E27.055; 438/312; 438/340; 438/342
(58) Field of Classification Search ............ 257/197, 257/565, 571, E21.608, E21.696, E27.055; 439/312, 340, 342

See application file for complete search history.

(56) References Cited

U.S. PATENT DOCUMENTS 5,523,606 A    6/1996    Yamazaki (Continued)

FOREIGN PATENT DOCUMENTS

| EP | 0 418 185 A1 | 7/1990 |
| EP | 0 949 665 A2 | 4/1999 |
| EP | 1 128 422 A1 | 8/2001 |

OTHER PUBLICATIONS

H.J. Osten et al., *The Effect of Carbon Incorporation on SiGe Heterobipolar Transistor Performance and Process Margin*; IEEE 1997 0-7803-4100 (pp. 32.4.1-32.4.4).

*Primary Examiner*—Long Pham
(74) *Attorney, Agent, or Firm*—Ware, Fressola, Van Der Sluys & Adolphson LLP

(57) ABSTRACT

A bipolar transistor has a base with an epitaxial base layer and a raised base connection region which in a lateral direction in parallel relationship with the substrate surface encloses the emitter which is surrounded by a spacer of insulating material. The epitaxial base layer is raised in a heightwise direction perpendicularly to the substrate surface. An emitter of a T-shaped cross-sectional profile is separated laterally from the outer base portion by a spacer of insulating material. Its vertical bar of the T-shape adjoins with its lower end the inner base portion. The lateral extent of the spacer increases from its interface with respect to the base layer with increasing height above the base layer, wherein a first interface formed by the emitter and the spacer meets a second interface formed by the emitter and the inner base portion at a first angle which is either a right angle or an obtuse angle, and a third interface formed by the spacer and the outer base portion meets the second interface at a second obtuse angle which is larger than the first angle.

26 Claims, 6 Drawing Sheets

U.S. PATENT DOCUMENTS

| | | |
|---|---|---|
| 6,492,238 B1 | 12/2002 | Ahlgren et al. |
| 6,642,553 B1 | 11/2003 | Drews et al. |
| 7,425,754 B2 * | 9/2008 | Akatsu et al. ............... 257/565 |
| 2001/0009793 A1 * | 7/2001 | Sato ........................... 438/342 |
| 2002/0117733 A1 | 8/2002 | Racanelli |
| 2003/0189239 A1 | 10/2003 | Kalnitsky et al. |
| 2005/0242373 A1 * | 11/2005 | Ahlgren et al. ............. 257/197 |

* cited by examiner

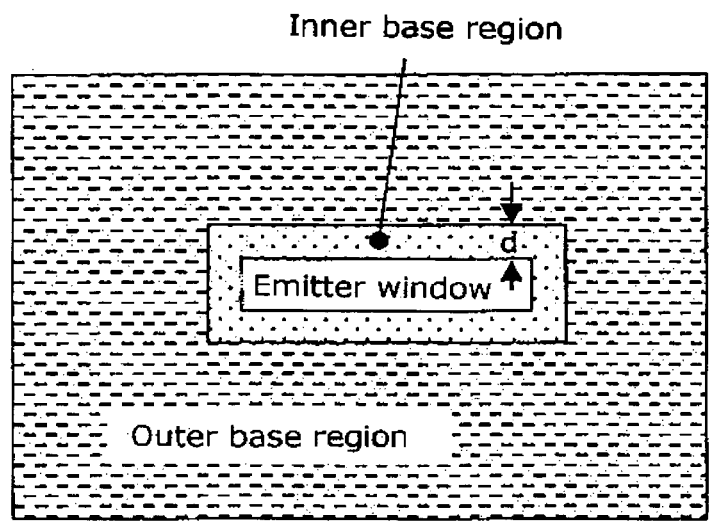
Fig. 1  State of the art
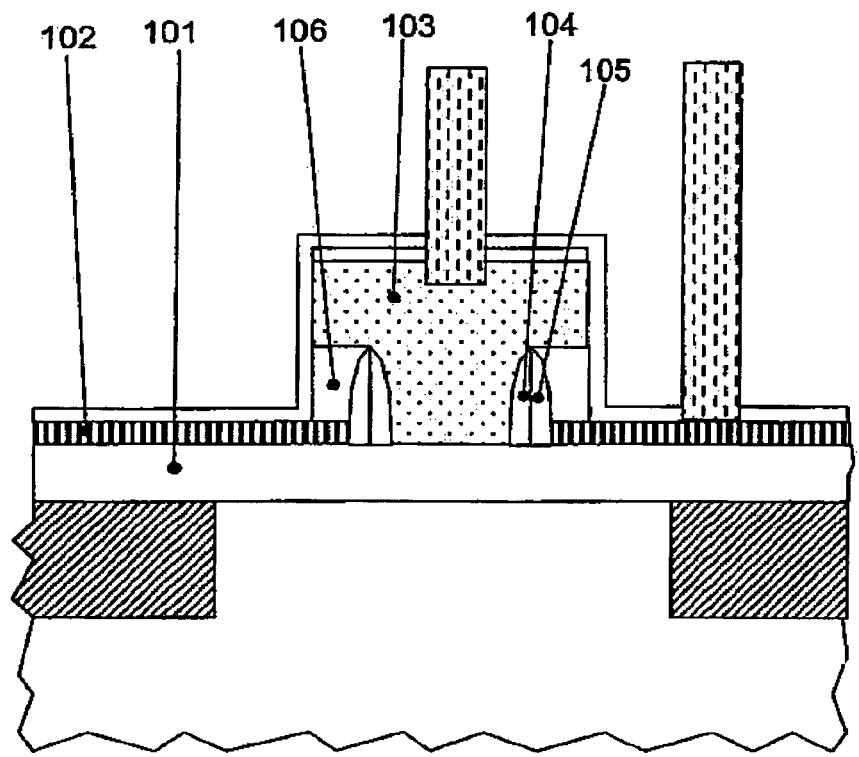
Fig. 2  State of the art

BIPOLAR TRANSISTOR WITH RAISED BASE CONNECTION REGION AND PROCESS FOR THE PRODUCTION THEREOF

CROSS REFERENCE TO RELATED APPLICATIONS

This application is for entry into the U.S. national phase under §371 for International Application No. PCT/EP2004/013954 having an international filing date of 3 Dec. 2004, and from which priority is claimed under all applicable sections of Title 35 of the United States Code including, but not limited to, Sections 120, 363 and 365(c), and which in turn claims priority under 35 USC §119 to German Patent Application No. DE 103 58 046.8 filed on 5 Dec. 2003.

BACKGROUND OF THE INVENTION

1. Technical Field

The invention relates to a bipolar transistor with raised base connection region and a process for the production thereof.

2. Discussion of Related Art

Bipolar transistors are used in many different ways in integrated analog and digital electronic circuits. In particular, bipolar transistors are used for high-speed uses because of their short switching times. It was possible to considerably increase the operational efficiency of bipolar transistors in the high-speed area by vertical and lateral scaling of the transistor dimensions and by the introduction of epitaxially produced base layers.

In particular the development of heterobipolar transistors contributed to that. In heterobipolar transistors the emitter and base layers comprise different semiconductor materials, the emitter having a larger band gap than the base. An example in that respect is SiGe-heterobipolar transistors in which the emitter comprises silicon (Si) and the base contains a silicon-germanium alloy (SiGe).

The high frequency properties of modern bipolar transistors are limited in the case of increasing scaling by the resistances of base, emitter and collector as well as parasitic base-emitter and base-collector capacitances. In particular the limit frequency of power amplification can be increased by a reduction in the base resistance. That limit frequency is referred to as $f_{max}$. In addition a reduction in the base resistance results in an improvement in the noise properties of the transistor.

The conventional way of reducing base resistance is ion implantation in the extrinsic base region which hereinafter is also referred to as the outer base portion or the outer base region (English term: extrinsic base region). Transistors produced in that way suffer from the disadvantage that implantation damage which occurs in the ion implantation procedure results in increased diffusion of the doping atoms and as a result ultimately limits the operational efficiency of the transistors. FIG. 1 shows the extrinsic and intrinsic base regions in a plan view on to a bipolar transistor.

An alternative concept for reducing base resistance while avoiding implantation damage is to reinforce the base layer by an additional semiconductor layer in the outer base portion. In accordance with the known state of the art, there are two alternative approaches for implementing such reinforced base connection layers:

(1) Production processes which are based on selective epitaxy of the inner base layer portion. The inner base layer portion, hereinafter also referred to as the intrinsic base layer, intrinsic base region or intrinsic base area, forms the region of the base which is arranged in the lateral region of the emitter window therebeneath. Production processes involving selective epitaxy usually employ a polysilicon layer produced prior to deposit of the inner base portion, as the base connection. A transistor of that kind was described by Yamazaki in U.S. Pat. No. 5,523,606. Selective epitaxy is used to deposit a base layer on exposed parts of the substrate surface and in cavities which are formed by the substrate surface and overhangs of the polysilicon layer serving as the base connection. A substantial disadvantage of that structure is poor process control for selective deposit beneath the overhanging polysilicon layer. In addition deposit of the intrinsic base beneath the overhanging base connection layer leads to an increase in the area of the base-collector junction, whereby base-collector capacitance is increased. Those structural limitations ultimately result in a limitation in the high frequency parameters.

(2) Ahlgren et al, U.S. Pat. No. 6,492,238, describe the production of a raised base connection region by means of chemical-mechanical polishing (CMP). The corresponding transistor structure is diagrammatically shown in FIG. 2. Transistors produced in accordance with U.S. Pat. No. 6,492,238 have an epitaxial base layer 101 and a raised outer base portion 102. The emitter 103 is separated from the raised outer base portion 102 by the insulating layer 106 and by an inner spacer layer or spacer 104 and an outer spacer layer 105. A disadvantage of that structure is that the insulation formed by the double spacer 104/105 between the emitter and the raised outer base portion is of its greatest width at the boundary of the epitaxial base layer 101. That structure has been found to be disadvantageous in joint minimisation of base resistance and base-emitter capacitance and accordingly causes restrictions in terms of the high frequency parameters. In addition the choice of the thickness of the insulating layer 106 is limited by the tolerances of the known CMP processes. An excessive thickness of the insulating layer 106 can lead to elevated levels of emitter resistance. In addition the complexity of the production process is substantially increased by the dual application of CMP processes in accordance with U.S. Pat. No. 6,492,238.

(3) EP 0 949 665 A2 discloses a bipolar transistor in which the outer base portion is formed by the diffusion of boron out of a highly doped polysilicon layer into the subjacent monocrystalline silicon. That highly doped polysilicon layer is disposed on an insulating layer in an outward direction. A spacer separates the polysilicon layer from the emitter, which is of an approximately T-shaped configuration. The inner base portion is produced by ion implantation. A disadvantage in regard to the high frequency properties of the transistor structure described therein is on the one hand the great depth of penetration of the diffused-in outer base portion into the monocrystalline layer, as is necessary for a low-ohmic connection of the inner base portion. That increases the base-collector capacitance.

DISCLOSURE OF INVENTION

In comparison with the known state of the art the technical object involved is that of providing a bipolar transistor having a low base resistance, which can be produced at a low level of complication and expenditure and in which the base and the emitter are improved in terms of good high frequency suitability for use of the bipolar transistor.

That object is attained by a bipolar transistor as well as a process as set forth below.

The invention is based on the realisation that it is possible to reduce the base resistance if the spacer layer between the emitter and the outer base portion is of a narrow configuration in terms of its lateral extent (width) at the boundary to the inner base portion. At the same time the invention involves the realisation that on the other hand an excessively small average width in respect of the spacer layer has detrimental effects on the base-emitter capacitance. A disadvantage of the previously known structures described is accordingly in particular that the insulation between the emitter and the outer base layer at the boundary relative to the inner base layer is of a large width and in part is even at its greatest width. That involves an unnecessarily increased base resistance, in the light of the present invention.

The basic idea of the invention is to minimise the lateral extent of the spacer between the emitter and the outer base portion at its interface relative to the inner base portion and to cause it to grow with increasing height over the inner base portion.

In accordance with a first aspect of the invention the object is therefore attained by a bipolar transistor on a substrate comprising a base having an inner base portion and an outer base portion which adjoins the inner base portion in a lateral direction parallel to the substrate surface and in a heightwise direction facing in perpendicular relationship to the substrate surface is of a greater extent than the inner base portion, an emitter of a T-shaped cross-sectional profile which is separated from the outer base portion laterally by a spacer of insulating material and whose portion which corresponds to the vertical bar of the T-shape with its lower end in the heightwise direction adjoins the inner base portion (4a).

In the bipolar transistor according to the invention the lateral extent of the spacer between the emitter and the outer base portion beneath a portion of the emitter, which corresponds to the horizontal bar of the T-shape, increases from the interface of the spacer relative to the inner base portion with increasing height over the inner base portion. The increase in the lateral extent of the spacer occurs in such a way that a first interface formed by the emitter and the spacer meets a second interface formed by the emitter and the inner base portion at a first angle which is either a right angle or an obtuse angle, and a third interface formed by the spacer and the outer base portion meets the second interface at a second obtuse angle which is larger than the first angle. On the one hand that provides that the base resistance of the bipolar transistor assumes a value which is as low as possible. For, due to the minimum lateral extent of the spacer at its lower interface, that is to say the interface in relation to the inner base portion, the lateral extent of the inner base portion which is characterised by a lower doping level and a higher layer resistance is minimised and a low base resistance is embodied for the transistor. On the other hand the lateral extent of the spacer, which increases in the heightwise direction, provides that the parasitic capacitance between the emitter and the raised outer base portion is as low as possible.

The solution according to the invention provides a compromise between minimising the base resistance and minimising the parasitic base-emitter capacitance, which accordingly in comparison with previously known solutions leads to an improvement in the high frequency properties of the bipolar transistor according to the invention.

Embodiments by way of example of the bipolar transistor according to the invention are described hereinafter.

The minimum lateral extent of the spacer at the interface relative to the inner base portion is preferably between 5 and 80 nm. Further preferably the range is between 10 and 60 nm. Particularly preferably the range is between 15 and 50 nm. The minimum lateral extent should not be selected to be excessively low in the sense of a compromise between base resistance and base-emitter capacitance.

The increase in the lateral extent of the spacer is preferably effected continuously.

In an alternative embodiment the increase in the lateral extent of the spacer takes place stepwise. In the case of a stepwise increase the steps correspond to very slight heightwise steps which are much less than the difference in height of the inner and outer base portions. In the case of a stepped increase a first interface formed by the emitter and the spacer also meets a second interface formed by the emitter and the inner base portion at a first angle which is either a right angle or an obtuse angle, and a third interface formed by the spacer and the outer base portion meets the second interface at a second obtuse angle which is larger than the first angle. In that respect however it is not possible to enlist the entire interface between the emitter and the spacer and between the spacer and the outer base portion respectively for the purposes of defining the angle, but in each case consideration is given to only one or more subregions of those interfaces, which at any event include the region directly at the interface of the emitter and the inner base portion.

In a preferred embodiment the first interface formed by the emitter and the spacer meets the second interface formed by the emitter and the inner base portion at an obtuse first angle ($\alpha$). The obtuse angle $\alpha$ is preferably between 100° and 135°. The increase in the lateral extent of the spacer with increasing height over the inner base portion is preferably so implemented that a third interface formed by the spacer and the outer base portion meets the second interface at a second obtuse angle which is larger than the first obtuse angle.

In order to implement an increase in the lateral extent of the spacer in this embodiment, the second obtuse angle must be of a value which is larger than that of the first obtuse angle. Preferably the second obtuse angle having regard to that boundary condition is of a value 180°-$\beta$, wherein $\beta$ is between 40° and 75°.

In an alternative embodiment the first angle is a right angle. In this embodiment the increase in the lateral extent of the spacer is provided by the third interface formed by the spacer and the outer base portion meeting the second interface at a second obtuse angle. Preferably also in this embodiment the second obtuse angle is 180°-$\beta$, wherein $\beta$ is between 40° and 75°.

Preferably the inner base portion is of a monocrystalline nature. That provides particularly good high frequency parameters.

In a further embodiment the lateral spacer, in the heightwise direction, can have one or more further layer portions whose interfaces with the emitter are at an obtuse angle which is larger than $\alpha$. Furthermore the spacer can comprise a stack of a plurality of layer portions whose lateral extent increases with increasing height over the inner base portion.

The provision of a raised outer base portion can be particularly easily implemented in terms of process engineering with a construction in which the base includes a first base layer and a second base layer which is disposed on the first base layer, wherein the second base layer is at least partially opened in the lateral region of the inner base portion to form an emitter window.

Preferably the second base layer or both base layers in the outer base portion, to reduce the base resistances involve a dopant concentration which is increased in comparison with the inner base portion, wherein the higher dopant concentration is restricted to a heightwise portion above a maximum of the dopant concentration in the inner base portion. Restricting the high level of doping to the region above the maximum of the doping of the inner base portion serves to avoid increased base-collector capacitances. The dopant concentration in the second base layer can be above $1\times10^{19}$ cm$^{-3}$ and is preferably of the same conductivity type as that of the epitaxial first base layer. A dopant concentration for the second base layer of between $2\times10^{19}$ cm$^{-3}$ and $2\times10^{20}$ cm$^{-3}$ is particularly preferred.

A particularly low level of base resistance is achieved in the case of a bipolar transistor in which the outer base layer laterally surrounds the inner base portion at a plurality of or all four sides.

In order to prevent diffusion of the dopant out of the highly doped raised base layer into adjacent portions of the transistor and thus an extension of the base region, the inner base portion or the outer base portion or both base portions are additionally doped with carbon. The carbon concentration is preferably between $5\times10^{18}$ cm$^{-3}$ and $5\times10^{20}$ cm$^{-3}$. A carbon concentration of between $1\times10^{19}$ cm$^{-3}$ and $1\times10^{20}$ cm$^{-3}$ is particularly preferred.

In a further embodiment the second base layer entirely or partially comprises a silicon-germanium layer. That permits a further reduction in the base resistance by virtue of a further increase in doping.

The emitter is of a T-shaped cross-sectional profile to achieve a particularly low emitter resistance. In that case the emitter portion corresponding to the horizontal bar of the T-shape lies above the outer base portion. In a preferred embodiment the portion of the emitter corresponding to the horizontal bar of the T-shape is separated by a second spacer of insulating material from the outer base portion disposed therebeneath. The lateral ends of the portion of the emitter, which corresponds to the horizontal bar of the T-shape, can be separated by a third spacer of insulating material from the outer base portion laterally adjoining same therebeneath. Both measures serve to reduce the base-emitter capacitance.

The choice of the insulating material for use in the insulating regions between the emitter and the outer base portion is basically a free one. Preferably silicon dioxide SiO$_2$ which can be very well managed in process engineering is used. Basically however the use of other insulating materials is also possible, for further optimisation. The use of an insulating material with a lower dielectric constant $\in$ than silicon dioxide can be envisaged to achieve a base-emitter capacitance which is as low as possible. Such a measure would make it possible to reduce the lateral extent of the spacer at the interface relative to the inner base portion without the base-emitter capacitance going above the value which would occur when using SiO$_2$.

In accordance with a second aspect of the invention there is provided a process for the production of a bipolar transistor. The process can be used in the context of a bipolar or a BiCMOS process and comprises the following steps:

a) depositing a layer stack on an epitaxial base layer which contains at least one auxiliary layer to be later removed and a first insulating layer (6), b) opening the emitter window by portion-wise removal of the layer stack, c) depositing a second insulating layer, and d) structuring the second insulating layer in such a way that a spacer of insulating material is produced at the edge of the emitter window, the lateral extent (d) of the spacer increasing from its interface with respect to the epitaxial base layer with increasing height over the epitaxial base layer, e) depositing an emitter layer, in the emitter window and on the second insulating layer and producing an emitter of T-shaped cross-sectional profile by lateral structuring of the emitter layer and producing spacers of insulating material in the side surfaces of the emitter, f) exposing the semiconductor surface of the base layer in the lateral regions of the outer base portion and depositing a raised base connection layer on said areas.

In accordance with the invention the steps recited in the last three paragraphs d), e), and f) are carried out in such a way that a first interface formed by the emitter and the spacer meets a second interface formed by the emitter and an inner base portion at a first angle which is either a right angle or an obtuse angle, and a third interface formed by the spacer and the raised base connection layer in the outer base portion meets a second interface formed by the spacer and the inner base portion at a second obtuse angle which is larger than the first angle.

The advantages of the process of the invention will be readily apparent from the foregoing presentation of the advantages of the bipolar transistor according to the invention. Embodiments by way of example of the process according to the invention are described hereinafter.

In addition an advantage of the process according to the invention is that it permits deposit, which is self-adjusting in relation to the emitter window, of a raised base connection region.

A further preferred embodiment has the following steps up to the step of producing the emitter window:

providing a prepared substrate on which at least one active bipolar transistor region and optionally additionally at least one active CMOS region is defined, depositing an auxiliary layer on the prepared substrate and opening a window in the auxiliary layer over the active bipolar transistor region, and depositing an epitaxial base layer in which base doping is introduced in situ.

In accordance with a third aspect of the invention there is provided an alternative process for the production of the bipolar transistor according to the invention comprising the steps:

providing a prepared substrate on which either exclusively active bipolar transistor regions or both active bipolar transistor regions and also active CMOS regions are defined, depositing an auxiliary layer on the prepared substrate and opening windows in said auxiliary layer in the active bipolar transistor regions, depositing an epitaxial base layer, depositing an insulating layer on the epitaxial base layer and producing an emitter window by portion-wise removal of the insulating layer, depositing an emitter layer and lateral structuring of the emitter in such a way that the emitter acquires a T-shaped cross-sectional profile, producing spacers of insulating material at the side surfaces of the emitter, selectively epitaxially depositing a raised base connection layer on the exposed regions of the epitaxial base layer forming a facet which meets the surface of the epitaxial base layer at an obtuse angle (180°-β), and producing a spacer of insulating material which covers the facet.

In that respect the term bipolar transistor region is used synonymously with the term 'bipolar region' which is also usual for the men skilled in the art. Described hereinafter are embodiments whose additional features can be used in conjunction with the two alternative production processes in accordance with the second or third aspect of the invention.

An embodiment comprises the following steps:

removing the epitaxial base layer, the raised base connection layer and the auxiliary layer from collector connection regions of the bipolar transistors and optionally from the CMOS regions, and optionally implanting source, drain and gate regions of the MOS transistors and healing the implantation damage as well as joint metallisation process for the bipolar and CMOS regions.

Preferably the epitaxial base layer is produced by means of a differential epitaxy process in such a way that a monocrystalline layer is produced on the active bipolar transistor region and a polycrystalline layer is produced on insulating regions. That permits the simultaneous deposit of the inner base region in monocrystalline form and the outer base region in polycrystalline form.

In a further embodiment the second base layer is deposited selectively on exposed regions of the first base layer by means of a selective epitaxy process. The second base layer is preferably monocrystallinely deposited in the regions adjoining the spacer.

BRIEF DESCRIPTION OF THE DRAWINGS

Further features and advantages of the invention will be apparent from the description hereinafter of the invention with reference to the Figures in which:

FIG. 1 shows a plan view of the outer and inner regions of a bipolar transistor in accordance with the state of the art, FIG. 2 shows a cross-sectional view of a bipolar transistor with a raised based connection layer in accordance with the known state of the art.

DETAILED DESCRIPTION

Three embodiments by way of example are described in greater detail hereinafter. Example 1 is a bipolar transistor. Example 2 is a process for the production of such a bipolar transistor. Example 3 is an alternative production process.

EXAMPLE 1

Figure 3:
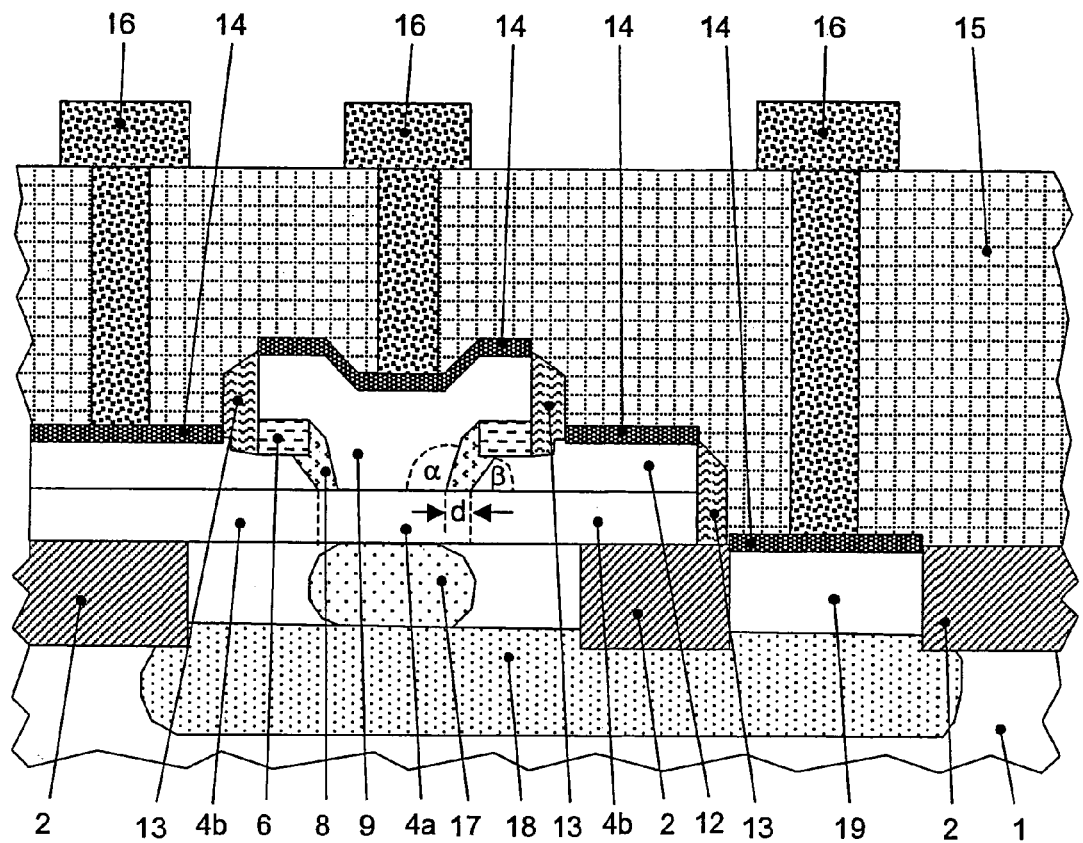
FIG. 3 shows a cross-sectional view of a bipolar transistor according to the invention with a raised based connection layer.

FIG. 3 is a cross-sectional view showing the structure of an embodiment of the bipolar transistor of the invention. In this example an npn-transistor with an epitaxial base is produced on a high-ohmic, p-conducting Si substrate 1. The essential features of the described arrangement can also be applied to other substrate dopings and pnp-transistors.

The npn-transistor includes an n-conducting emitter 9, a p-conducting base 4 and an n-conducting collector 17. The collector is brought into contact by way of an n-conducting region 18 and an n-conducting collector connection region 19. Arranged above the collector region is a first epitaxial base layer 4 which contains a p-doping. In particular the epitaxial base layer can include an SiGe layer. For example the epitaxial base layer can include a layer sequence Si/SiGe/Si. In addition the epitaxial base layer can be doped with carbon. The epitaxial base layer can be particularly advantageously produced by differential epitaxy. In that situation the layer grows monocrystallinely on active regions of the substrate and polycrystallinely on insulating regions 2.

The first base layer 4 has an inner base portion 4a. The lateral boundaries of the inner base portion 4a are identified by broken lines which at the same time indicate the lateral boundaries of an emitter window which is widened by the lateral extent of the spacer 8.

The emitter 9 is arranged above the epitaxial base layer. The emitter 9 comprises $n^+$-doped Si which can be monocrystalline or polycrystalline.

The emitter is surrounded laterally by a second base layer 12, here also referred to as the raised base connection layer, which is separated from the emitter by regions 6, 8, 13 of insulating material. The raised base connection layer 12 can be produced for example by selective epitaxy in which layer growth is restricted to the exposed Si surface of the epitaxial base layer 4. Emitter, base and collector are connected by silicide layers 14 and metal contacts 16 which are separated by insulating regions 15.

The raised base connection layer 12 preferably comprises silicon, SiGe or a layer stack of Si and SiGe. The raised base connection layer 12 is also monocrystalline above the monocrystalline region of the epitaxial base layer 4. The portions, which lie outside the lateral boundaries of the inner base portion 4a, of the first epitaxial base layer 4 and the second base layer (raised base connection layer) 12 form an outer base portion 4b. It will be appreciated that the layer structure basically plays no part in terms of the definition of the inner and outer base portions. The outer base portion can also comprise only one or a plurality of layers. What is essential in the present context is that the outer base portion in the height-wise direction is of a greater extent, or to put it briefly, thicker, than the inner base portion.

The doping of the raised base connection layer 12 is of the same conductivity type as that of the epitaxial base layer. The doping can be introduced for example in situ during the selective layer growth operation. In the npn-transistor of the present embodiment the raised base connection layer is doped with boron in a concentration above $1 \times 10^{19}$ cm$^{-3}$, preferably in a concentration range of $2 \times 10^{19}$ cm$^{-3}$ to $2 \times 10^{20}$ cm$^{-3}$.

In situ doping can also involve non-homogeneous doping which has one or more doping maxima.

The p-doping of the raised based connection layer can be increased by ion implantation. In that case the energy of the implanted ions is so selected that their depth of penetration is restricted to the region above the maximum of the doping of the epitaxial base layer 4 in order to avoid an increase in the base-collector capacitance.

The raised base connection layer can additionally be doped with carbon. The carbon doping serves to control the diffusion of other dopants, in particular boron, out of the raised base connection layer into the inner base portion disposed therebeneath and to suppress the influence of possible implantation damage on the diffusion of dopants.

Carbon doping can be introduced for example in situ during growth of the raised base connection layer. It can extend over the entire thickness of the raised base connection layer or can be restricted to parts thereof. The carbon concentration is of a value of between $5 \times 10^{18}$ cm$^{-3}$ and $5 \times 10^{20}$ cm$^{-3}$, preferably between $1 \times 10^{19}$ cm$^{-3}$ and $1 \times 10^{20}$ cm$^{-3}$.

The emitter and the raised base connection layer 12 are separated from each other by an insulating region which in the embodiment comprises an insulating spacer 8, the remaining part of an insulating intermediate layer 6 and a further insulating spacer 13. The insulating regions 6, 8 and 13 comprise silicon dioxide. In order to reduce the base resistance of the bipolar transistor the lateral extent d of the insulating layer 8 is as small as possible at the boundary to the inner base portion of the epitaxial base layer 4. The lateral extent d of the spacer is also referred to hereinafter as its thickness. At the boundary to the first base layer 4 the spacer 8 is of a thickness of 5 nm to 80 nm, preferably 15 nm to 50 nm.

The angle β which is formed by the outside edge of the spacer 8 and the surface of the base layer 4 is less than 90°. Preferably the angle β is of a value of between 40° and 75°. The spread angle α of the side surfaces of the emitter is greater than 90° and is preferably of a value of between 100° and 135°. The increase in the emitter width in an upward direction which is achieved in that way leads to a reduced emitter resistance. That provides for optimum distribution of the base current with a minimum base-emitter capacitance.

EXAMPLE 2

A first process for the production of a bipolar transistor with a raised base connection region will now be described with reference to FIGS. 4 through 9. In the following Figures the same structural elements are denoted by the same references.

In particular the process according to the invention permits the production of high-speed bipolar transistors in integrated bipolar and BiCMOS procedures.

The embodiment involves a process for the production of npn-bipolar transistors on a p-conducting substrate 1. Active regions and insulating regions 2 are structured on the substrate 1. By way of example n-conducting regions 18, 19 were produced in the region of the collector of the transistor by masked ion implantation.

n-Conducting and p-conducting wells are produced in the CMOS regions and gates of polysilicon are structured and provided with lateral spacers.

An auxiliary layer 3 is deposited on the Si wafers structured as described. That auxiliary layer can be in particular a layer stack of different materials, in particular silicon dioxide and silicon nitride. The auxiliary layer 3 is opened by means of a lacquer mask over the active regions of the bipolar transistor (FIG. 4).

The base layer 4 is monocrystallinely grown on the opened active regions of the bipolar transistor. The epitaxial base layer 4 can include in particular an SiGe layer and a doping with carbon. The p-doping of the intrinsic base is introduced in situ during the layer growth procedure. For depositing the base layer 4, it is possible to use in particular a differential epitaxy process in which a polycrystalline layer is grown on the exposed insulating regions 2 and on the auxiliary layer 3.

Figure 4:
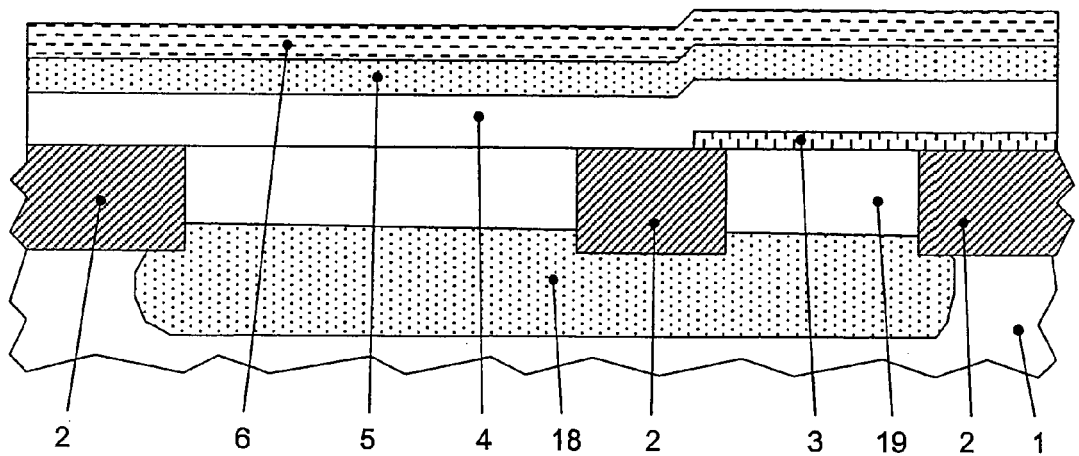
FIG. 4 shows a cross-sectional view of the bipolar transistor of FIG. 3 in a first production phase after deposit of the inner base layer and subsequent deposit of a dielectric double layer.

A further auxiliary layer 5 which can comprise a double layer of silicon dioxide and silicon nitride and an insulating layer 6 are deposited on the base layer (FIG. 4). The auxiliary layer 5 comprises for example a silicon dioxide layer of a thickness of 5 nm to 30 nm and a silicon nitride layer of a thickness of 40 nm to 150 nm. The insulating layer 6 is for example a silicon dioxide layer of a thickness of 50 nm to 150 nm.

A window which defines the active emitter surface is opened in the insulating layers 5, 6 by means of a lacquer mask. That window is also referred to as the emitter window. Structuring of the insulating layer 6 is effected by reactive ion etching (RIE). The lacquer mask is then removed and the auxiliary layer 5 opened, for example by an isotropic wet etching process. The wet etching process selectively etches the layer 5 of silicon nitride but not the layer 6 which comprises silicon dioxide. The enlargement of the opening of the auxiliary layer 5 in an upward direction, as shown in FIG. 5, is effected by the isotropic etching step.

In a configuration of the invention the lacquer mask used to open the emitter window is used to implant an additional collector doping 17 in self-adjusted relationship with respect to the emitter window.

Figure 5:
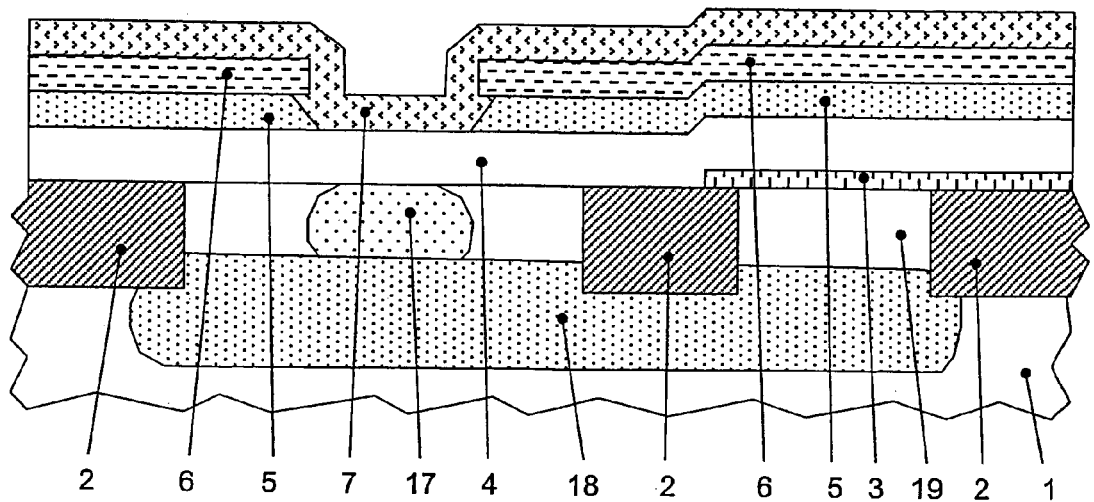
FIG. 5 shows a cross-sectional view of the bipolar transistor in FIG. 3 in a second production phase after opening of the emitter window and deposit of a further dielectric layer.
Figure 6:
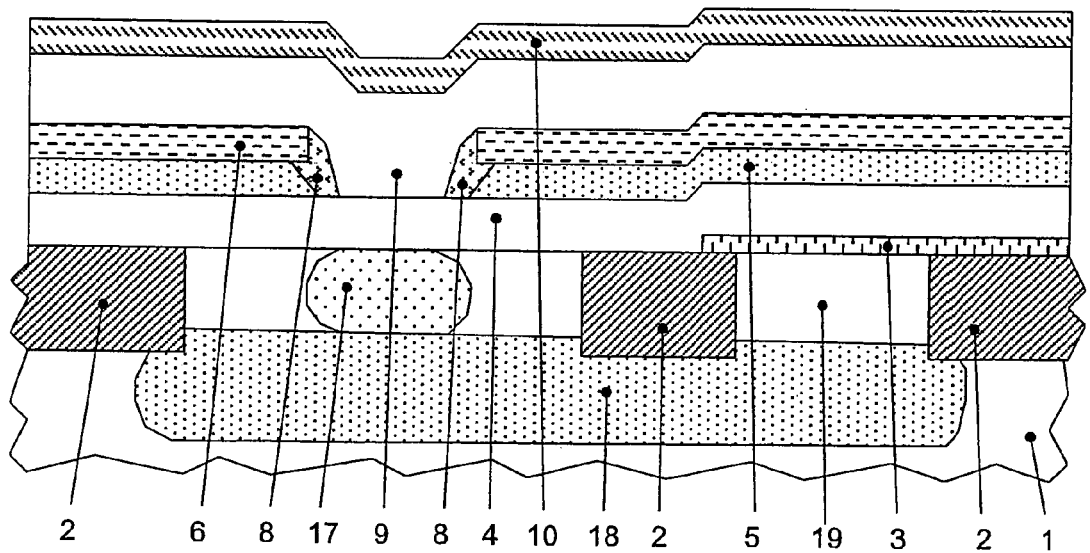
FIG. 6 shows a cross-sectional view of the bipolar transistor of FIG. 3 in a third production phase after the deposit of the emitter.

In a further step an insulating layer 7 is deposited, which preferably comprises silicon dioxide and is of a thickness of 30 nm to 150 nm (FIG. 5). That insulating layer is etched back by means of an anisotropic RIE procedure, with spacers 8 being shaped within the opened emitter window (FIG. 6).

The emitter 9 is deposited in a further step. The emitter preferably comprises silicon which is provided in situ with n$^+$-doping.

The emitter can be monocrystalline or polycrystalline in the region of the emitter window. A further insulating layer 10 is deposited above the emitter layer, which preferably comprises silicon dioxide or a layer stack of silicon dioxide and silicon nitride (FIG. 6).

Figure 7:
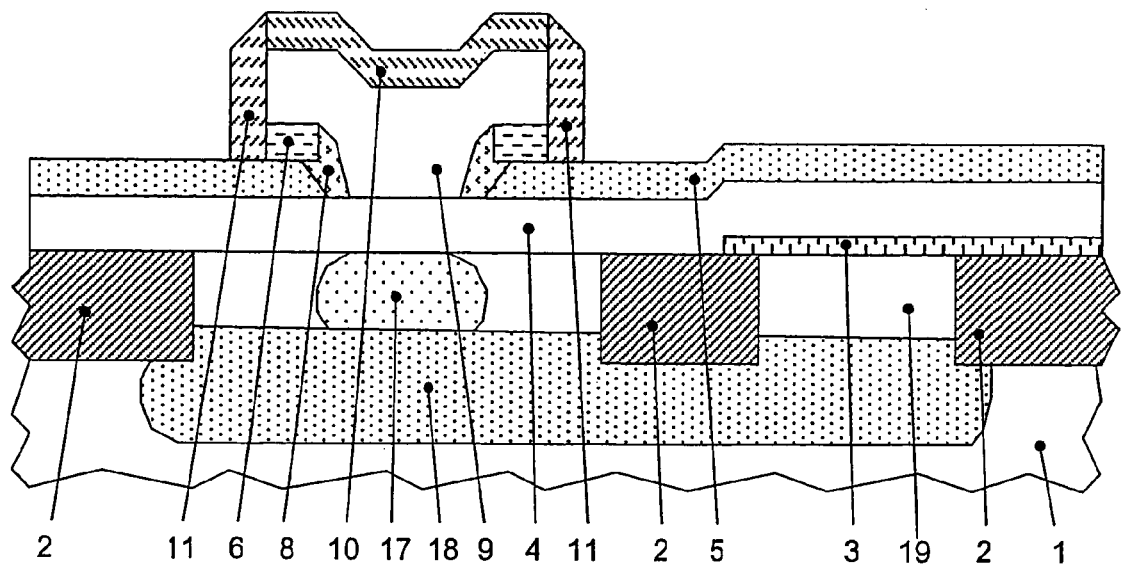
FIG. 7 shows a cross-sectional view of the bipolar transistor of FIG. 3 in a fourth production phase after structuring of the emitter and the formation of spacers.

The emitter layer 9 and the insulating layers 10 and 6 are structured in a further step by way of a lacquer mask (FIG. 7). Spacers 13 which for example comprise silicon dioxide are then produced at the side surfaces of the emitter. The auxiliary layer 5 can be used as a stop layer in the operation of structuring the emitter layer and in the subsequent spacer etching operation.

The auxiliary layer 5 is then removed. A selective wet etching procedure is used for that purpose, which removes the auxiliary layer 5 comprising silicon nitride but does not remove the encasing 6, 8, 10, 11 of the emitter, which is formed from silicon dioxide.

Figure 8:
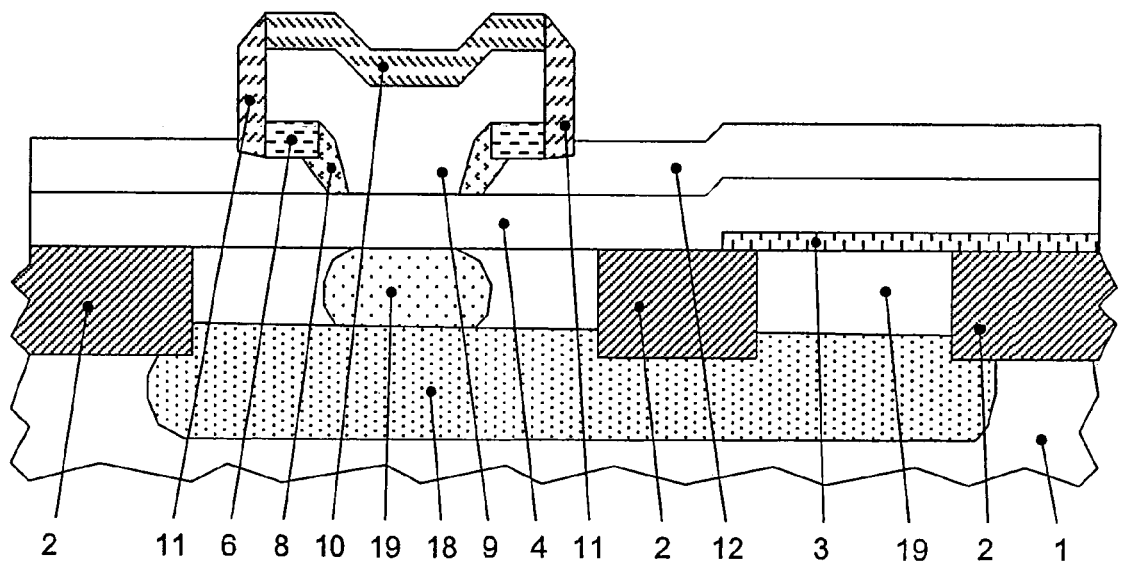
FIG. 8 shows a cross-sectional view of the bipolar transistor of FIG. 3 in a fifth production phase after selected growth of the raised base connection layer.

The raised base connection layer 12 is deposited on the exposed surface of the base layer 4 by means of selective epitaxy (FIG. 8). In particular the selective deposit operation is also effected under the overhanging regions of the emitter but not on the insulating layers 6, 8, 10, 11 which encase the emitter. That provides for self-adjustment of the raised base connection layer 12 with respect to the emitter 9, wherein the spacing of the two layers is defined by the shape of the spacer 8.

In a further step the base layers 4 and 12 are completely removed from the collector connection regions and the CMOS regions, by means of a further lacquer mask. An RIE procedure can be used for that purpose, which stops on the auxiliary layer 3. The auxiliary layer 3 is then removed. The CMOS regions are thus again in the same state as prior to deposit of the auxiliary layer 3.

In a BiCMOS procedure doping of the source-drain regions of the MOS transistors is effected in the following process steps, in accordance with the known state of the art.

Figure 9:
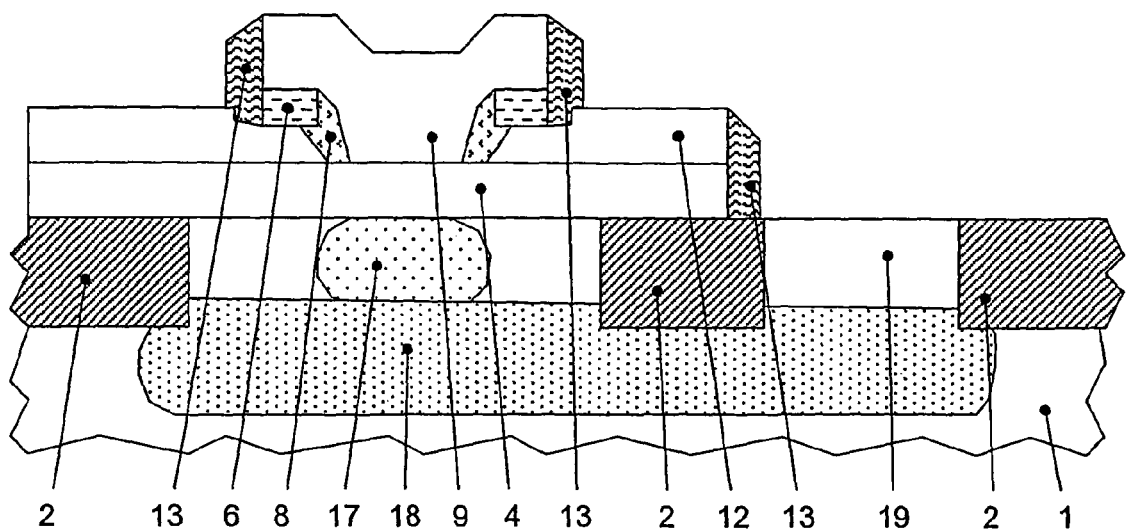
FIG. 9 shows a cross-sectional view of the bipolar transistor of FIG. 3 in a sixth production phase after structuring of the base layer.

In a configuration of the process according to the invention the insulating layer 10 and the spacers 11 were removed from the emitter by wet-chemical process steps. In that configuration spacers 13 can further be produced at the side surfaces of the emitter and base layer (FIG. 9).

In a further step the exposed semiconductor surfaces of the base, emitter and collector regions of the bipolar transistors are silicised jointly with the source, drain and gate regions of the MOS transistors (14 in FIG. 3). Bipolar and MOS transistors are then contacted in a common metallisation process in accordance with the known state of the art.

EXAMPLE 3

A second process for the production of a bipolar transistor with a raised base connection region differs from the process described in Example 2 essentially in that the raised base connection region is not deposited in self-adjusted relationship with the emitter window. That process will now be described with reference to FIGS. 10 and 11.

Up to deposit of the base layer 4 the process is identical to the process described in Example 2. An insulating layer 20 is then deposited on the base layer 4. That insulating layer preferably comprises silicon dioxide and is preferably of a thickness of between 40 nm and 150 nm.

Figure 10:
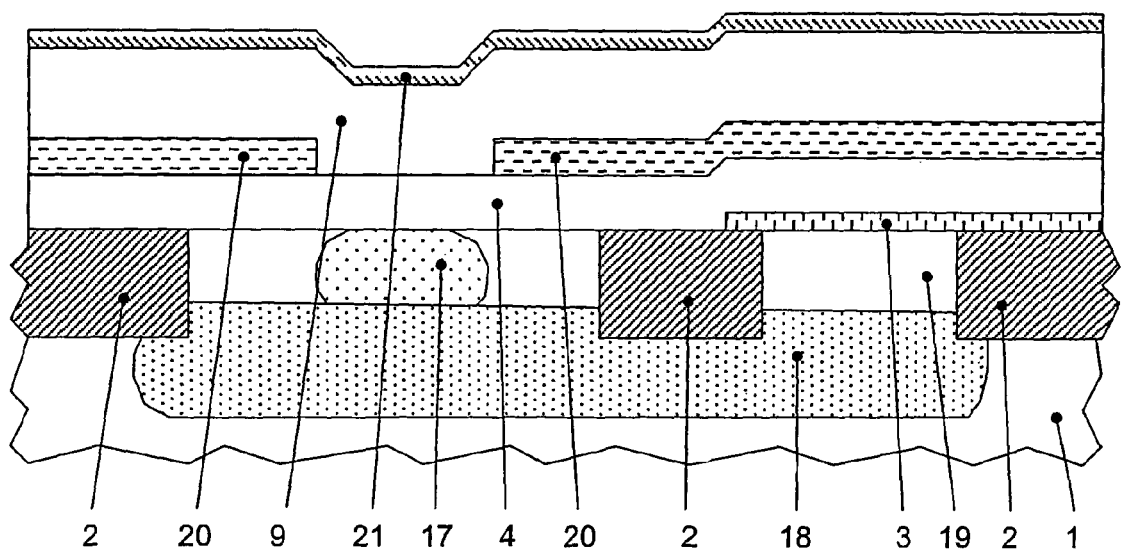
FIG. 10 shows a cross-sectional view of a bipolar transistor which is produced in an alternative process according to the invention, in a first production phase after deposit of the emitter layer and an insulating layer above the emitter layer.

An emitter window is structured in the insulating layer 20 by way of a lacquer mask. The emitter 9 is deposited in a further step. The emitter preferably comprises silicon which is provided in situ with an $n^+$-doping. The emitter can be monocrystalline or polycrystalline in the region of the emitter window. An insulating layer 21 which preferably comprises silicon dioxide is deposited above the emitter layer in an embodiment of the invention (FIG. 10).

The emitter layer 9 and the insulating layer 10 are structured in a further step by way of a lacquer mask. Spacers 22 which preferably comprise silicon nitride or silicon dioxide are then produced at the side surfaces of the emitter. In order to implement a minimum base resistance for the transistor the thickness of that spacer must be minimised. In accordance with the invention the thickness of the spacer is between 5 nm and 50 nm, preferably between 5 nm and 20 nm.

Figure 11:
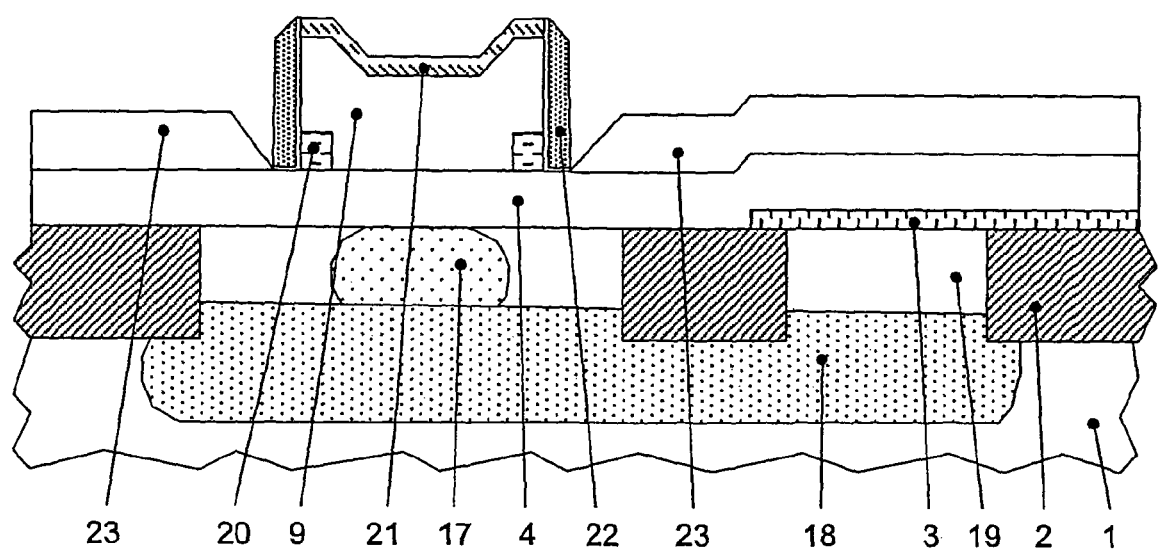
FIG. 11 shows a cross-sectional view of the bipolar transistor of FIG. 10 in a second production phase after selective deposit of the raised base connection layer.

The surface of the base layer 4 is exposed in the region outside the emitter by wet etching. The raised base connection layer 23 is deposited by means of selective epitaxy on the exposed surface of the base layer 4 (FIG. 11). That can be effected in particular by a selective epitaxy process which leads to the formation of a facet at an acute angle β at the boundary of the exposed silicon surface (FIG. 11).

The described facet of the raised base connection layer 23 is entirely or partially covered by a further spacer of insulating material (this is not shown) in one of the following process steps. That provides, between the emitter and the raised base connection layer, a configuration for the insulating region in which the lateral extent (d) of the spacer increases from its interface with the inner base portion with increasing height over the inner base portion.

After deposit of the raised base connection layer the process is continued as described in Example 2. In particular the process for production of high-speed bipolar transistors with a raised base connection layer can be applied both in bipolar and also in BiCMOS procedures.

In a further configuration of the process according to the invention for BiCMOS procedures both the raised base connection layer and also raised source-drain regions of MOS transistors can be produced by a selective epitaxy step. In particular the raised base connection layer which is $p^+$-doped in situ of the npn-bipolar transistor is also deposited on the exposed source and drain regions of the PMOS transistors. Source-drain regions which are raised in that way provide for reduced connection resistances of source and drain with at the same time a reduction in the depth of penetration of the source-drain regions into the substrate.

In that configuration of the invention prior to deposit of the outer base layer the intrinsic base layer 4 is removed from the CMOS regions on which selective deposit is to be effected. In addition the auxiliary layer 3 is removed from those regions. In a subsequent step selective deposit of the raised base connection layer and the raised source-drain regions is effected on the exposed surface of the intrinsic base layer 4 and on the Si regions which are exposed in the CMOS regions.

What is claimed is:

1. A bipolar transistor on a substrate comprising
 a base (4, 12) with an inner base portion (4a) and an outer base portion (4b) which adjoins the inner base portion (4a) in a lateral direction in parallel relationship with the substrate surface and in a heightwise direction facing perpendicularly with respect to the substrate surface and is of a greater extent than the inner base portion (4a), wherein the base includes a first epitaxial base layer (4) and a second base layer (12) disposed on the first layer (4) the second base layer (12) being opened in a lateral region above the inner base portion (4a) to form an emitter window (9, 4a),
 an emitter (9) of a T-shaped cross-sectional profile, which is separated from the outer base portion (4b) laterally by a spacer (8) of insulating material, wherein a lower end of a portion of the emitter (9), which corresponds to a vertical bar of the T-shaped cross-sectional profile, adjoins in the heightwise direction the inner base portion (4a),
 in which beneath a portion of the emitter (9), which corresponds to a horizontal bar of the T-shaped cross-sectional profile, a lateral extent (d) of the spacer (8) increases with increasing height over the inner base portion (4a), having a lowest value at an interface between the spacer (8) and the inner base portion (4a),
 wherein a first interface formed by the emitter (9) and the spacer (8) meets a second interface formed by the emitter and the inner base portion (4a) at a first angle (α) which is either a right angle or an obtuse angle, and
 a third interface formed by the spacer (8) and the outer base portion (4b) meets the second interface at a second obtuse angle which is larger than the first angle.

2. A bipolar transistor as set forth in claim 1 wherein the minimum lateral extent (d) of the spacer (8) at the interface to the inner base portion (4a) is between 5 and 80 nm.

3. A bipolar transistor as set forth in claim 1 wherein the minimum lateral extent (d) of the spacer (8) at the interface to the inner base portion (4a) is between 10 and 60 nm.

4. A bipolar transistor as set forth in claim 1 wherein the minimum lateral extent (d) of the spacer (8) at the interface to the inner base portion (4a) is between 15 and 50 nm.

5. A bipolar transistor as set forth in claim 1 wherein the obtuse angle (α) between 100° and 135°.

6. A bipolar transistor as set forth in claim 1 wherein the second obtuse angle is 180°-β, wherein β is between 40° and 75°.

7. A bipolar transistor as set forth in claim 1 with a higher dopant concentration in the outer base portion than in the inner base portion.

8. A bipolar transistor as set forth in claim 7 wherein the second base layer (12) or both base layers in the outer base portion (4b) have a dopant concentration which is increased in comparison with the inner base portion (4a), wherein the higher dopant concentration is restricted to a heightwise portion above a maximum of the dopant concentration in the inner base portion (4a).

9. A bipolar transistor as set forth in claim 1 wherein the inner base portion or the outer base portion or both base portions are additionally doped with carbon.

10. A bipolar transistor as set forth in claim 9 wherein the carbon concentration is between $5 \times 10^{18}$ cm$^{-3}$ and $5 \times 10^{20}$ cm$^{-3}$.

11. A bipolar transistor as set forth in claim 10 wherein the carbon concentration is between $1 \times 10^{19}$ cm$^{-3}$ and $1 \times 10^{20}$ cm$^{-3}$.

12. A bipolar transistor as set forth in claim 1 wherein the second base layer (12) has a dopant concentration between $2 \times 10^{19}$ cm$^{-3}$ and $2 \times 10^{20}$ cm$^{-3}$.

13. A bipolar transistor as set forth in claim 1 wherein the first base layer (4) or the second base layer (12) or both contain a silicon-germanium alloy.

14. A bipolar transistor as set forth in claim 1 wherein the outer base portion (12) laterally only partially surrounds the emitter (9).

15. A bipolar transistor as set forth in claim 1 wherein the portion of the emitter which corresponds to the horizontal bar of the T-shape is separated by a second spacer in the form of an insulating layer from the subjacent outer base portion.

16. A bipolar transistor as set forth in claim 15 wherein the lateral ends of the portion of the emitter which corresponds to the horizontal bar of the T-shape is separated by a third spacer of insulating material from the outer base portion laterally adjoining same therebeneath.

17. A bipolar transistor as set forth in claim 1 wherein the insulating material of the spacer (8) is $SiO_2$.

18. A process for the production of a bipolar transistor as set forth in claim 1, comprising the steps:
depositing a layer stack on an epitaxial base layer which contains at least one auxiliary layer (5) to be later removed and a first insulating layer (6),
opening the emitter window by portion-wise removal of the layer stack,
depositing a second insulating layer (7), and
structuring the second insulating layer (7) in such a way that a spacer (8) of insulating material is produced at the edge of the emitter window, the lateral extent (d) of the spacer increasing from its interface with respect to the epitaxial base layer (4) with increasing height over the epitaxial base layer (4),
depositing an emitter layer (9) in the emitter window and on the second insulating layer (7) and producing an emitter of T-shaped cross-sectional profile by lateral structuring of the emitter layer and producing spacers (11) of insulating material at the side surfaces of the emitter,
exposing the semiconductor surface of the base layer (4) in the lateral regions of the outer base portion (4b) and depositing a raised base connection layer on said areas,
wherein the last three steps are carried out in such a way that a first interface formed by the emitter (9) and the spacer (8) meets a second interface formed by the emitter and the inner base portion at a first angle ($\alpha$) which is either a right angle or an obtuse angle, and
a third interface formed by the spacer (8) and the raised base connection layer in the outer base portion (4b) meets a second interface formed by the spacer and the inner base portion at a second obtuse angle which is larger than the first angle.

19. A process as set forth in claim 18 comprising the following steps for producing the emitter window:
providing a prepared substrate (1) on which at least one active bipolar transistor region and optionally additionally at least one active CMOS region is defined,
depositing an auxiliary layer (3) on the prepared substrate (1) and opening a window in the auxiliary layer (3) over the active bipolar transistor region, and
depositing an epitaxial base layer (4) into which base doping is introduced in situ.

20. A process for the production of a bipolar transistor as set forth in claim 1 comprising the steps:
providing a prepared substrate on which either exclusively active bipolar transistor regions or both active bipolar transistor regions and also active CMOS regions are defined,
depositing an auxiliary layer (3) on the prepared substrate and opening windows in said auxiliary layer in the active bipolar transistor regions,
depositing an epitaxial base layer (4),
depositing an insulating layer (20) on the epitaxial base layer and producing an emitter window by portion-wise removal of the insulating layer (20),
depositing an emitter layer (9) and lateral structuring of the emitter in such a way that the emitter acquires a T-shaped cross-sectional profile,
producing spacers (22) of insulating material at the side surfaces of the emitter,
selectively epitaxially depositing a raised base connection layer (23) on the exposed regions of the epitaxial base layer (4) forming a facet which meets the surface of the epitaxial base layer at an obtuse angle (180°-β), and
producing a spacer of insulating material which covers the facet.

21. A process as set forth in claim 18 comprising the following steps after deposit of the raised base connection layer (12, 23):
removing the epitaxial base layer (4), the raised base connection layer (12) and the auxiliary layer (3) from collector connection regions of the bipolar transistors and optionally from the CMOS regions,
optionally implanting source, drain and gate regions to form MOS transistors and healing implantation damage, and
effecting a metallisation process for the bipolar and optionally at the same time also for the CMOS regions.

22. A process as set forth in claim 18 wherein the epitaxial base layer (4) is produced by means of a differential epitaxy process in such a way that a monocrystalline layer is produced on the active bipolar transistor region and a polycrystalline layer is produced on insulating regions.

23. A process as set forth in claim 18 wherein the second base layer (12) is selectively deposited by means of a selective epitaxy process on exposed regions of the first base layer (4).

24. A process as set forth in claim 18 wherein the second base layer (12) is monocrystallinely deposited in regions adjoining the spacers (8).

25. A process as set forth in claim 18 wherein the second base layer (12) is provided during the deposit operation in situ with a doping which is of the same conductivity type as the doping of the inner base.

26. A process as set forth in claim 20 comprising the following steps after deposit of the raised base connection layer (12, 23):

removing the epitaxial base layer (4), the raised base connection layer (12) and the auxiliary layer (3) from collector connection regions of the bipolar transistors and optionally from the CMOS regions, optionally implanting source, drain and gate regions to form MOS transistors and healing implantation damage, and effecting a metallisation process for the bipolar and optionally at the same time also for the CMOS regions.

* * * * *